(12) United States Patent
Popp et al.

(10) Patent No.: US 7,274,060 B2
(45) Date of Patent: Sep. 25, 2007

(54) MEMORY CELL ARRAY AND METHOD OF FORMING THE SAME

(75) Inventors: Martin Popp, Dresden (DE); Frank Jakubowski, Dresden (DE); Juergen Holz, Dresden (DE); Lars Heineck, Dresden (DE)

(73) Assignee: Infineon Technologies, AG, Neubiberg (DE)

( * ) Notice: Subject to any disclaimer, the term of this patent is extended or adjusted under 35 U.S.C. 154(b) by 41 days.

(21) Appl. No.: 11/152,793

(22) Filed: Jun. 15, 2005

(65) Prior Publication Data

US 2006/0284225 A1    Dec. 21, 2006

(51) Int. Cl.
*H01L 21/8244* (2006.01)
*H01L 29/94* (2006.01)

(52) U.S. Cl. .................. 257/302; 257/296; 438/238; 438/242

(58) Field of Classification Search .............. None
See application file for complete search history.

(56) References Cited

U.S. PATENT DOCUMENTS 5,945,707 A     8/1999 Bronner et al.
6,566,187 B1 *  5/2003 Willer et al. ........... 438/239
6,656,807 B2   12/2003 Bronner et al.
2005/0003308 A1 1/2005 Frohlich et al.

OTHER PUBLICATIONS

Kim, et al., "The Breakthrough in data retention time of DRAM using Recess-Channel-Array Transistor (RCAT) for 88 nm feature size and beyond," 2003 Symposium on VLSI Technology Dig. of Tech. Papers.

* cited by examiner

*Primary Examiner*—Sue A. Purvis
*Assistant Examiner*—Fazli Erdem
(74) *Attorney, Agent, or Firm*—Edell, Shapiro & Finnan, LLC

(57) ABSTRACT

A memory cell array includes memory cells with storage capacitor and an access transistor. The access transistors are formed in active areas. The memory cell array further includes bit lines oriented in a first direction and word lines oriented in a second direction. The active areas extend in the second direction. The bottom side of each gate electrode of the transistors is disposed beneath the bottom side of each word line. In addition, the word lines are disposed above the bit lines.

19 Claims, 16 Drawing Sheets

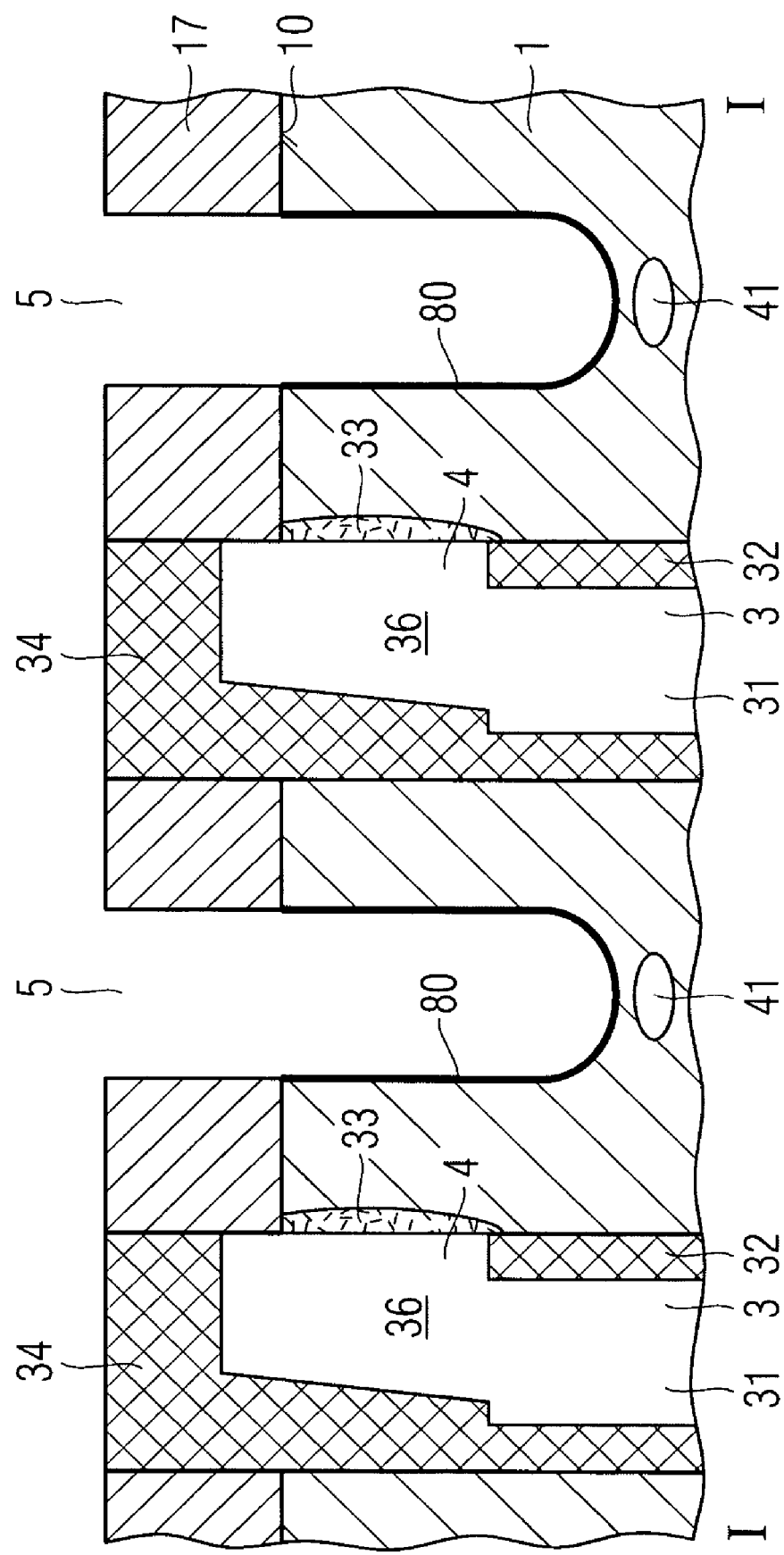

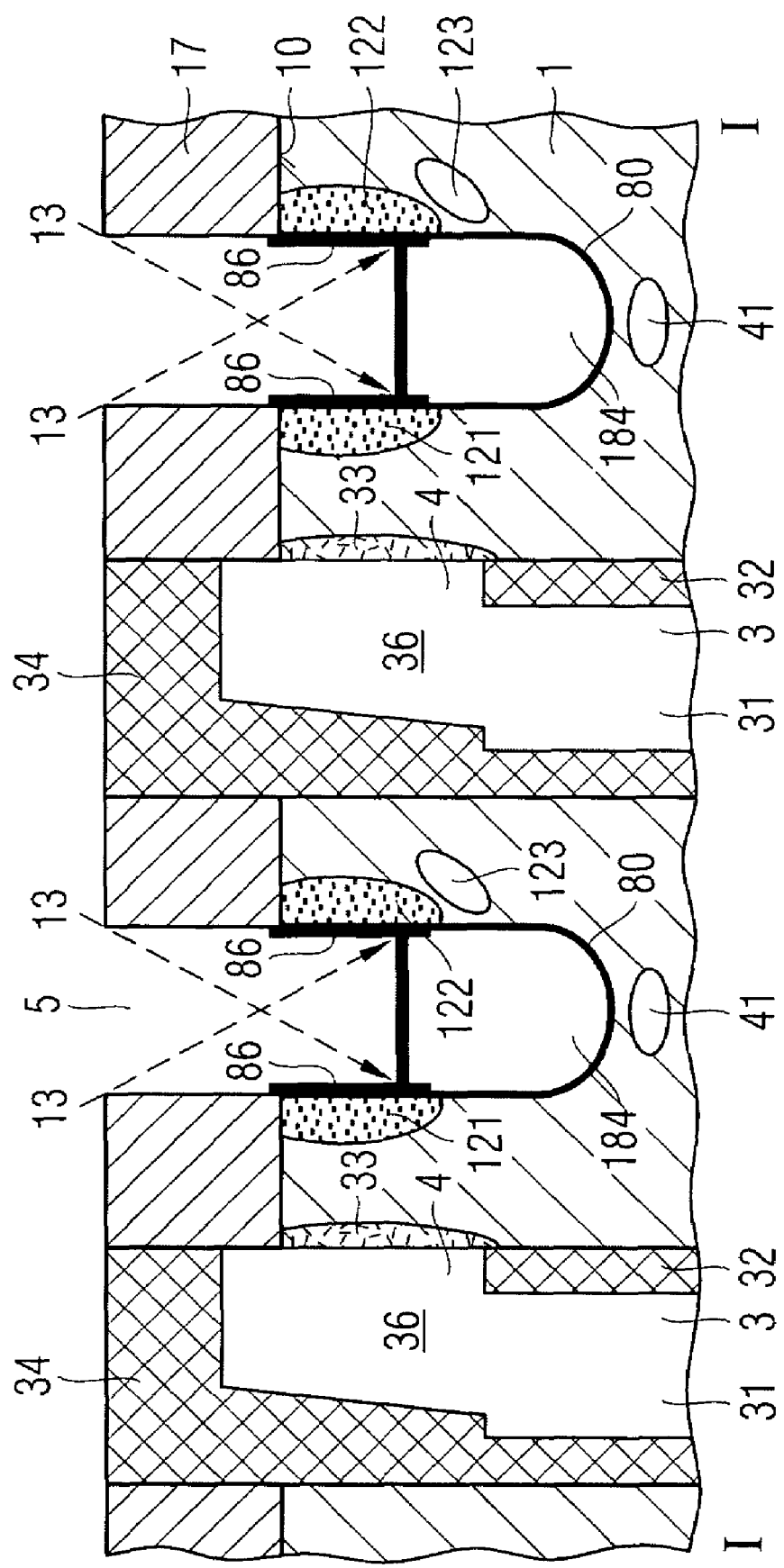

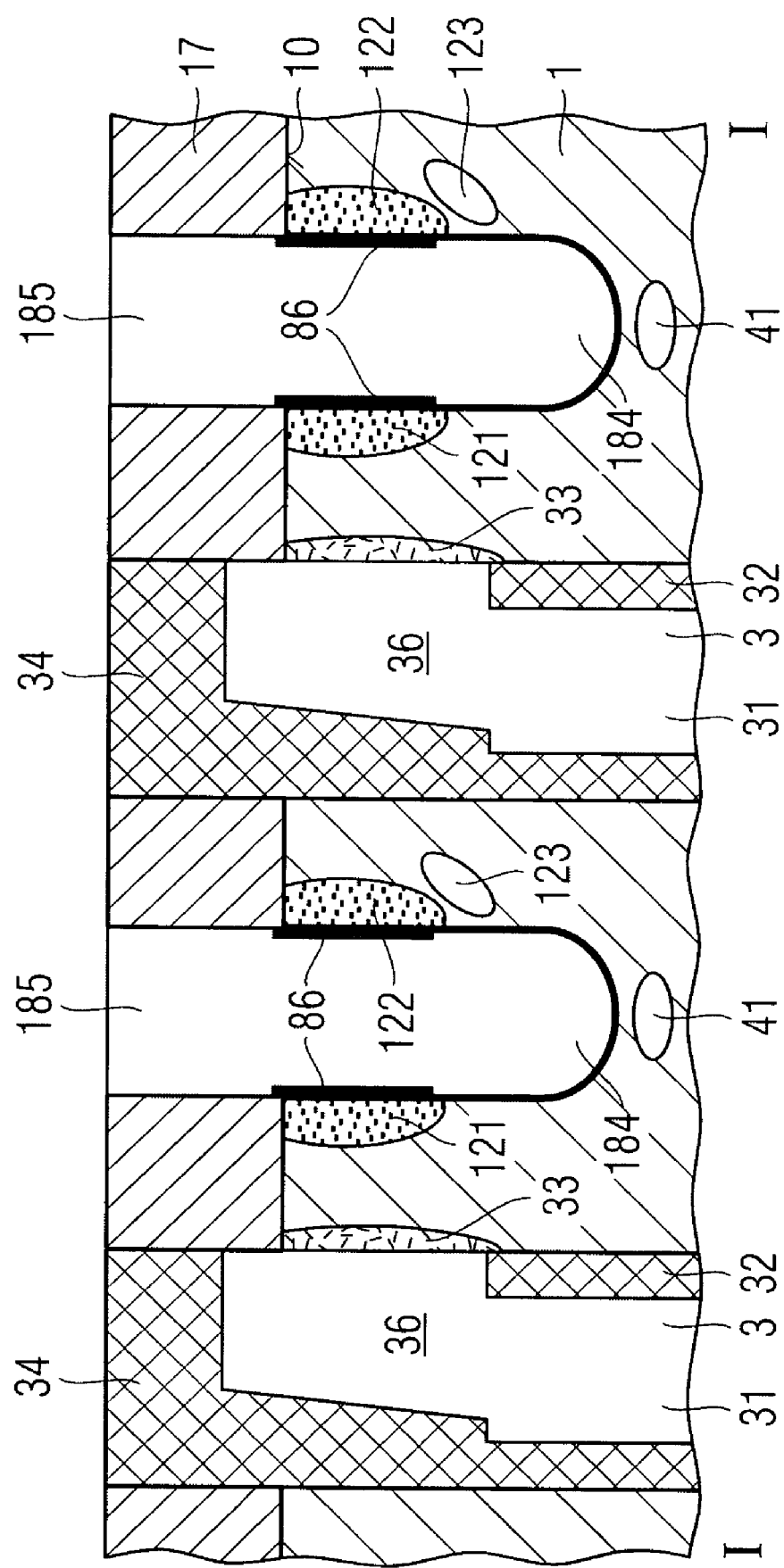

MEMORY CELL ARRAY AND METHOD OF FORMING THE SAME

FIELD OF THE INVENTION

The invention relates to memory cell arrays with a plurality of memory cells, such as Dynamic Random Access memory (DRAM) cells.

BACKGROUND

Memory cells of a dynamic random access memory (DRAM) generally comprise a storage capacitor for storing an electrical charge that represents information to be stored, and an access transistor connected with the storage capacitor. The access transistor includes first and second source/drain regions, a channel connecting the first and second source/drain regions, and a gate electrode controlling an electrical current flowing between the first and second source/drain regions. The gate electrode is electrically insulated from the channel by a gate dielectric. The transistor is usually partially formed in a semiconductor substrate, such as a silicon substrate. The portion in which the transistor is formed generally is denoted as the active area.

In conventional DRAM memory cell arrays, the gate electrode forms part of a word line. By addressing the access transistor via the corresponding word line, the information stored in the storage capacitor is read out.

In currently-used DRAM memory cells, the storage capacitor is implemented as a trench capacitor in which the two capacitor electrodes are disposed in a trench that extends into the substrate in a direction perpendicular to the substrate surface. According to another implementation of a DRAM memory cell, the electrical charge is stored in a stacked capacitor formed above the surface of the substrate.

The access transistor is, for example, implemented as a planar transistor, in which the channel extends horizontally along the surface of the semiconductor substrate.

A known DRAM cell has a grooved transistor, in which the gate electrode is disposed in a groove that extends in the substrate. Thereby, a current flowing from the first to the second source/drain regions and vice versa has horizontal and vertical components perpendicular to the substrate surface. This is further described in "The Breakthrough in data retention time of DRAM using Recess-Channel-Array Transistor (RCAT) for 88 nm feature size and beyond," J. Y. Kim, et al., 2003 Symposium on VLSI Technology Dig. of Tech. Papers. A further improvement of this transistor is also known. A method of forming special contact plugs is also known.

Memory devices usually comprise a memory cell array and a peripheral portion. The peripheral portion includes support circuitry for operating the memory cell array and, for example, sense amplifiers and word line drivers.

SUMMARY

According to the present invention, a memory cell array includes a plurality of memory cells, a plurality of bit lines oriented in a first direction, a plurality of word lines oriented in a second direction, a semiconductor substrate with a surface and a plurality of active area lines formed therein, and a plurality of access transistors partially formed in the active area lines and electrically coupling corresponding storage capacitors to corresponding bit lines. Each memory cell including a storage capacitor and an access transistor. The second direction is perpendicular to the first direction. Each access transistor including a first source/drain region connected to an electrode of the storage capacitor, a second source/drain region adjacent to the substrate surface, a channel region connecting the first and second source/drain regions, and a gate electrode disposed along the channel region. The channel region is disposed in the active area. The gate electrode controls an electrical current flowing between the first and second source/drain regions and is connected to one of the word lines. Each active area extends in the second direction. Each gate electrode and each word lines includes a bottom side. The bottom side of the gate electrodes is disposed beneath the bottom side of the word lines. The word lines are disposed above the bit lines.

In particular, according to the present invention, the word lines have a larger distance measured perpendicularly with respect to a substrate surface than the bit lines. This is in contrast to known memory cell arrays in which the word lines are directly adjacent to the substrate surface, and the bit lines are arranged above the word lines. In particular, each gate electrode is connected to a corresponding word line via a gate contact. In this case, the coupling between adjacent bit lines is largely decreased because the gate contacts effectively shield the bit lines from each other.

In addition, since the bottom side of the gate electrodes is disposed between the bottom side of the word lines, formation of the gate electrodes is separated from the formation of the word lines. As a consequence, formation of the word lines in the memory cell array are separated from formation of the gate electrodes in the peripheral portion. Thereby, forming the gate electrodes in the peripheral portion and forming the word lines in the array portion is optimized.

According to the present invention, the gate electrode is disposed in a groove that extends in a direction perpendicular to the substrate surface. As a result, the array transistor is, for example, a recess-channel-array transistor (RCAT) with improved retention time characteristics. Retention time refers to the time during which information is recognizably stored in a memory cell.

According to an exemplary embodiment, the storage capacitor is a trench capacitor with the first and a second capacitor electrodes and the dielectric layer are arranged in a trench that extends in the semiconductor substrate. The dielectric layer is disposed between the first and second capacitor electrodes.

The storage capacitor is, for example, a stacked capacitor in which the first and second capacitor electrodes and the capacitor dielectric are disposed above the substrate surface.

The memory cell array of the present invention, for example, includes an insulating spacer that electrically insulates the gate electrode from the first and second source/drain regions. The insulating spacer is extends perpendicularly with respect to the semiconductor substrate surface. Thereby, the electrical field of the gate electrode is shielded from the first and second source/drain regions to reduce a leakage current and increase a retention time.

According to the present invention, the channel connecting the first and second source/drain regions includes, for example, vertical portions and a horizontal portion with respect to the substrate surface. The horizontal portion is adjacent to the bottom side of the gate electrode.

Further, the horizontal portion of the channel includes a region doped with a dopant of the conductivity type of the channel at a concentration higher than the dopant concentration of the channel. For example, if the channel is p-doped, the horizontal portion of the channel includes a $p^+$-doped portion. Thereby, the threshold voltage of the transistor can be adjusted.

For instance, the word lines are made of a metal. Thereby, the conductivity of the word lines is increased.

In addition, a method of forming a memory cell array includes providing a semiconductor substrate having a surface, providing a plurality of storage capacitors, defining a plurality of active area lines in the semiconductor substrate, providing a plurality of access transistors by providing a first source/drain region in one of the active areas, electrically connecting the first source/drain region with an electrode of the storage capacitor, providing a second source/drain region in the active area at a position adjacent to the substrate surface, providing a gate electrode disposed along the channel region, providing a plurality of bit lines extending in a first direction, and providing a plurality of word lines extending in a second direction. Each word line is connected to a plurality of gate electrodes. The active areas extend in the second direction. Each gate electrode and each word line include a bottom side. The bottom side of the gate electrodes is disposed beneath the bottom side of the word lines. Providing the bit lines occurs before providing the word lines.

BRIEF DESCRIPTION OF THE DRAWINGS

Features of the invention will become more readily apparent from a consideration of the following detailed description set forth with reference to the accompanying drawings which specify and show preferred embodiments of the invention, wherein like elements are designated by the same references throughout the drawings; and in which:

FIGS. 1A, 1B, 2A, 2B, 3, 4, 5A, 5B, 6A, 6B, 7, 8, and 9 show corresponding views of the memory cell array during formation of the memory cell array according to an embodiment of the present invention;

DETAILED DESCRIPTION

In the following detailed description, reference is made to the accompanying drawings, which form a part hereof, and in which are illustrated by way of illustration specific embodiments in which the invention may be practiced. In this regard, directional terminology such as "top," "bottom," "front," "back," "leading," "trailing," etc., is used with reference to the orientation of the Figures being described. Because components of embodiments of the present invention can be positioned in a number of different orientations, the directional terminology is used for purposes of illustration and in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 10A:
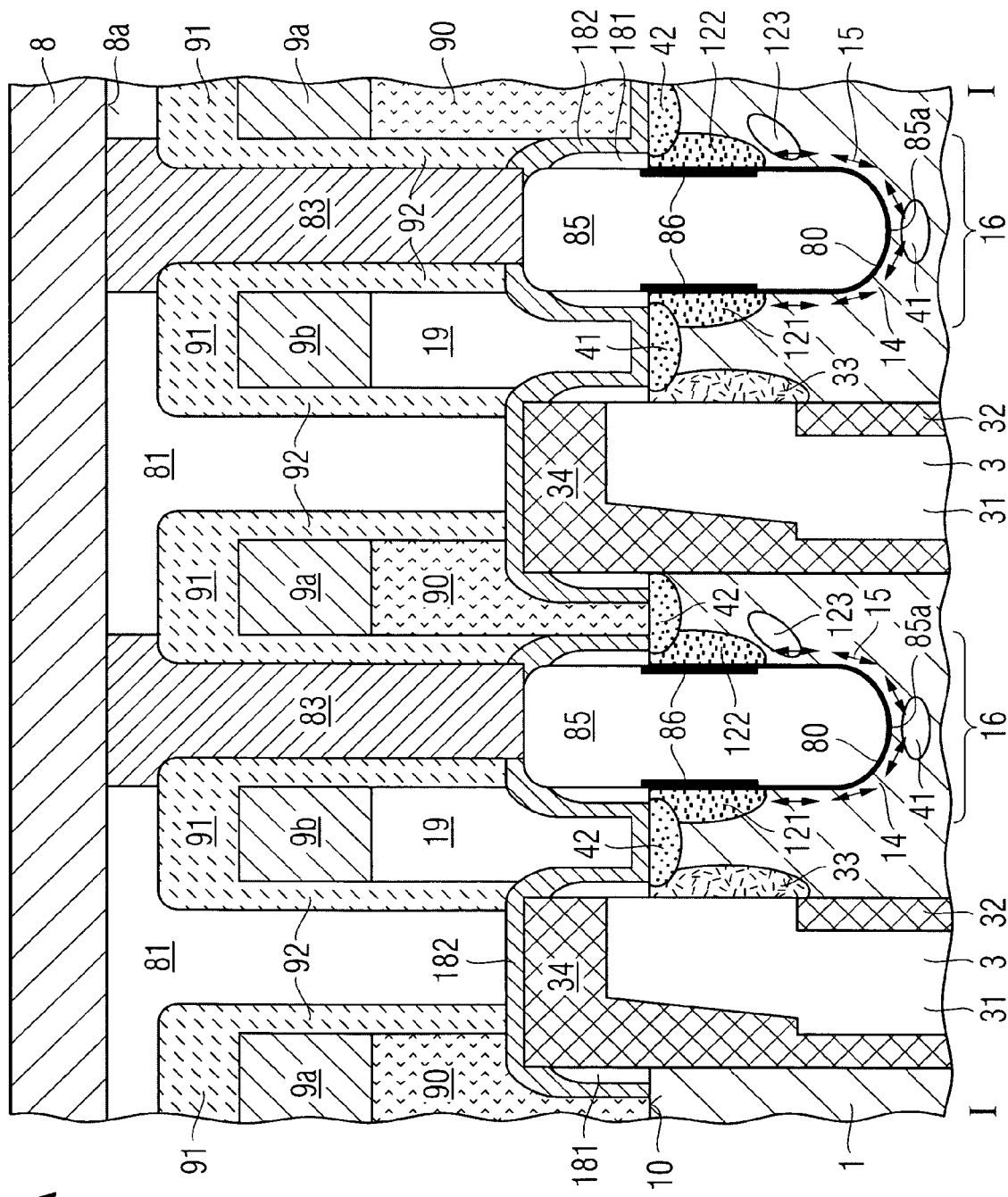
FIG. 10A shows a cross-sectional view of the memory cell array of the present invention.

FIG. 10A shows a cross-sectional view of the memory cell array of the present invention. Each memory cell includes a storage capacitor implemented as a trench capacitor 3. The trench capacitor 3 is formed in a trench extending in the semiconductor substrate, such as a silicon substrate 1. The inner capacitor electrode, the outer capacitor electrode, and the capacitor dielectric are formed in the trench. In particular, the trench capacitor includes an inner and an outer electrode. The outer electrode (not shown in this drawing) is adjacent to a side wall of the trench. The inner electrode 31 is connected via a polysilicon filling 36, a buried strap outdiffusion portion 33, and a channel implantation portion 41 to the first source/drain region 121 of the transistor 16.

In the upper portion of the trench, an isolation collar 32 is provided as is known. On top of the trench, a trench top oxide 34 electrically insulates the trench from the remaining portions of the memory cell array. The transistor 16 includes a first source/drain region 121 and a second source/drain region 122. The gate electrode 85 of the transistor is formed in a gate groove extending in the substrate. The gate electrode 85 is insulated from the channel connecting the first and second source/drain regions 121, 122 by a gate oxide 80. As shown, a current path 15 of a current flow between the first and second source/drain regions 121, 122 includes vertical components and horizontal components with respect to the substrate surface 10. Optionally, a channel implantation portion 41 is provided at the bottom portion of the channel. By the implanted portion, the threshold voltage of the transistor is set so that a relatively large retention time is obtained. In addition, optionally, an asymmetric doped portion 123 is provided near the second source/drain region 122 to weaken the electrical field in this portion and increase the threshold voltage of the transistor. Thereby, the characteristics of the transistor 16 are further improved. As an additional option, an inner spacer 86 shields the electrical field of the gate electrode 85 from the first and second source/drain regions 121, 122, thereby eliminating a leakage current that would degrade the retention characteristics of the memory cell.

For example, the channel 14 is lightly $p^-$-doped and the first and the second source/drain regions are n-doped. The asymmetric doped portion is p-doped. The implanted channel portion is p-doped.

Figure 10B:
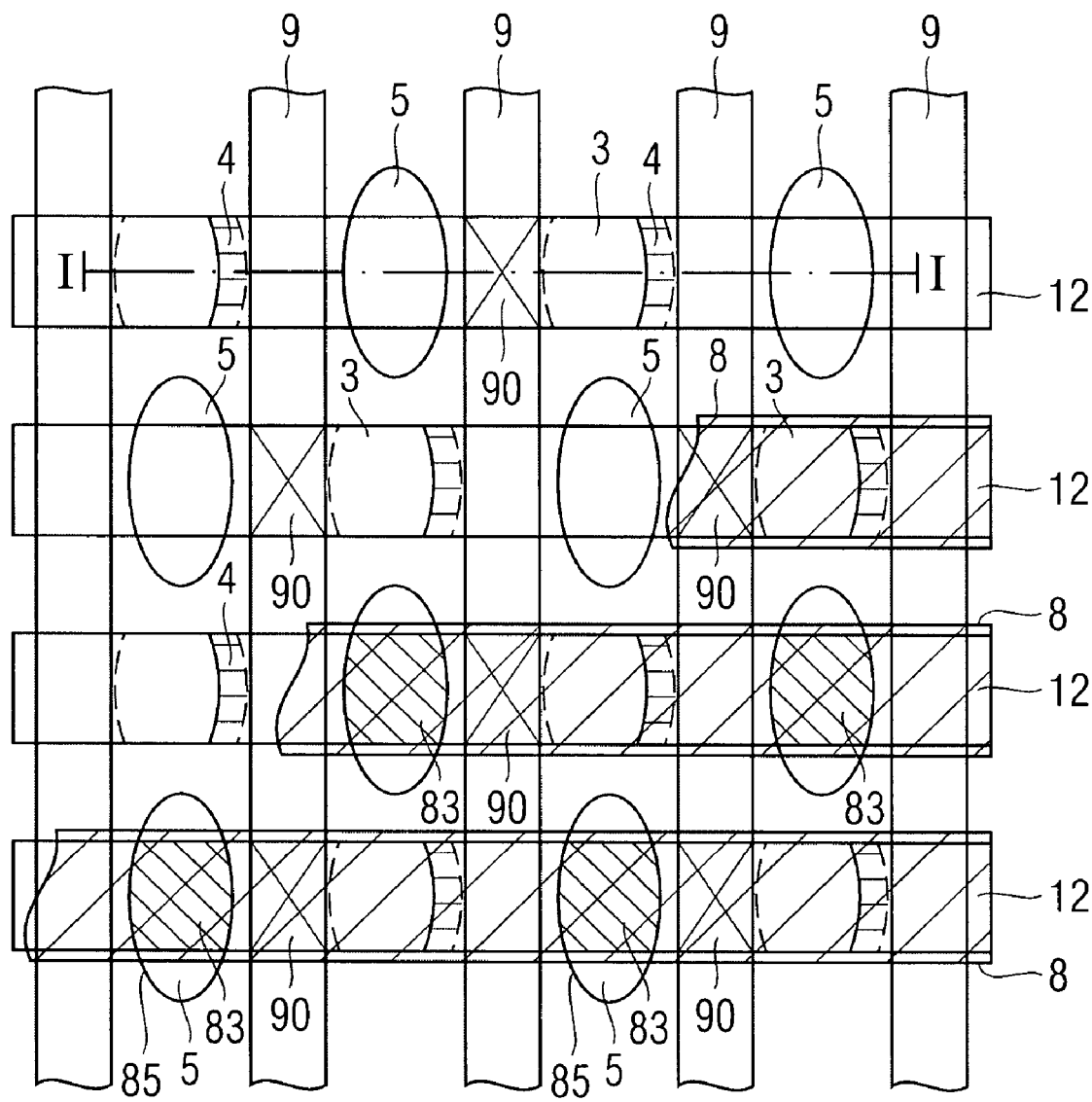
FIG. 10B shows a plan view on the memory cell array of the present invention.

Referring to FIG. 10B, the illustrated cross-sectional view is taken along an active area 12, between I and I. Bit lines 9 are arranged in a direction perpendicular to the direction of the active areas 12. As shown in FIGS. 10A and 10B, each second bit line 9a is connected via a bit line contact 90 with a corresponding implanted portion 42 that is connected with the second source/drain region 122. Each second bit line 9b is insulated from the active area line beneath. The bit lines 9a connected with the transistors are referred to active bit lines. The bit lines 9b, which are not connected with the transistors that are lying beneath the bit lines in the depicted cross-sectional view, are referred to as passing bit lines. Each bit line is covered by a bit line insulator layer 91. The side walls of each bit line is covered by a bit line insulator 92. Above the bit line level, word lines 8 are arranged in a direction parallel to the direction of the active areas 12. The word line 8 is connected with a gate electrode 85 via a gate contact 83. The word line 8 is insulated from the bit lines by the BPSG layer 81. The bottom side of the word line 8a is disposed above the bottom side of the gate electrode 85a.

In operation, a memory cell is selected, for example, by activating the corresponding word line 8. The word line 8 is connected with the shown gate electrodes 85. By activating the word line 8, the transistor 16 is turned on, whereby information stored in the trench capacitor is read out via the buried strap out diffusion portion 33, the implanted portion 42, the first source/drain region 121, and the second source/drain-region 122, and transmitted to the bit line 9a via the bit line contact 90.

As shown in FIG. 10, the coupling between neighboring bit lines 9b, 9a is decreased because of the gate contacts 83 disposed between adjacent bit lines. In addition, since the word line 8 is disposed on top of the bit lines, formation of the word lines is separated from formation of the gate electrodes. As a result, the word lines are formed of a metal, thereby decreasing the resistance of the word lines. In addition, the bit line contacts 90 are formed to have a relatively smaller length whereby the characteristics of the memory cell array are further improved. The bit line contacts 90 have a relatively smaller aspect ratio of depth to diameter. As a result, the R-C-characteristics of the device are improved.

Figure 1A:
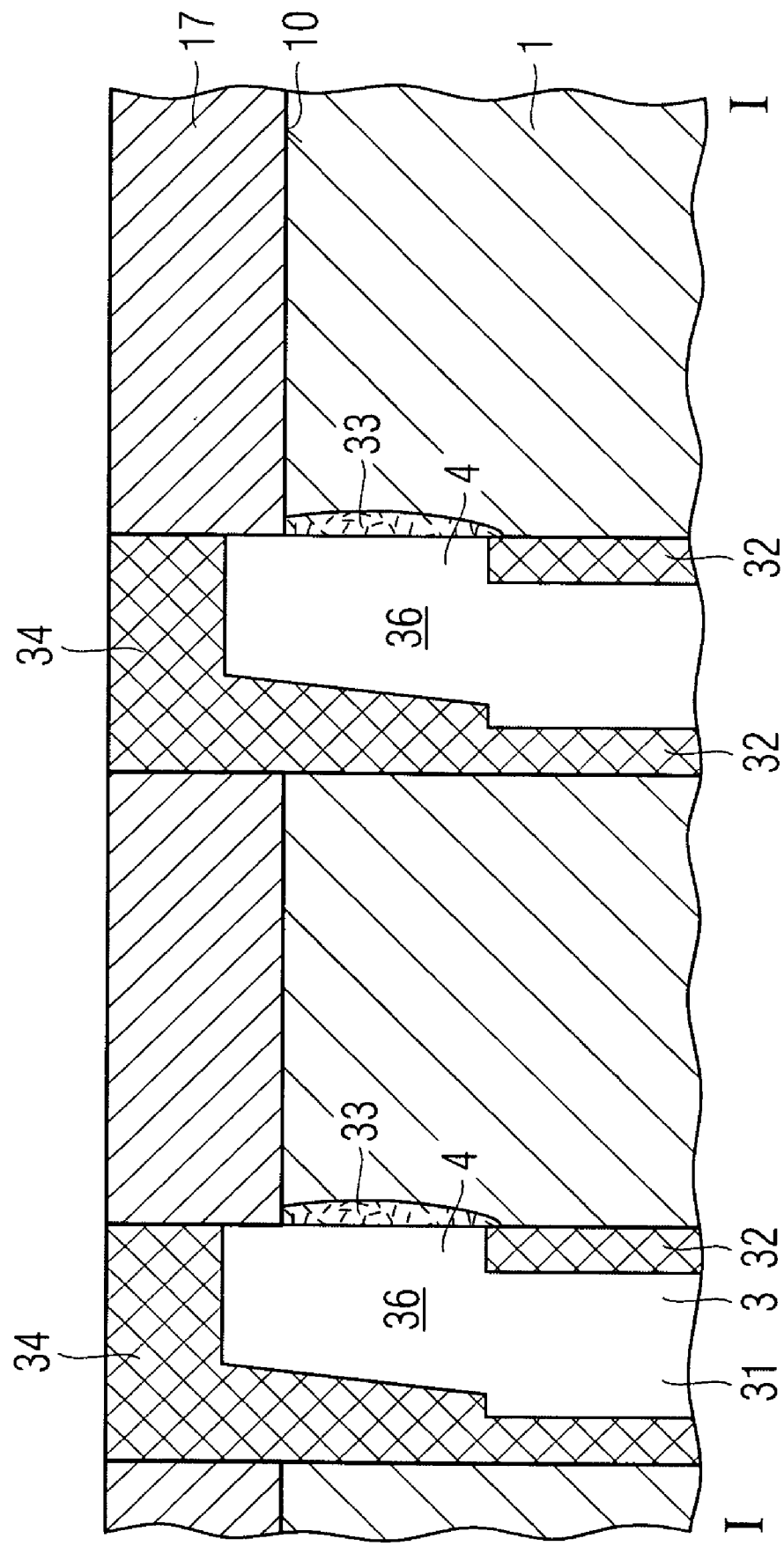

The steps for forming the memory cell array shown in FIG. 10 will be described in detail. The cross-sectional view of FIG. 1A shows the structure obtained after forming the capacitor trenches, and after patterning and filling the isolation trenches whereby the active areas are defined. For example, this structure is obtained by depositing a pad oxide layer (not shown) and a silicon nitride layer 17, as is commonly used in the art, on a semiconductor substrate 1, for example, a silicon substrate, by generally well known methods.

Thereafter, the capacitor trenches are photolithographically defined by known methods. For example, openings corresponding to openings in a trench mask are etched into a hard mask layer (not shown), which is deposited above the silicon nitride layer 17. Thereafter, the openings are etched into the silicon nitride layer 17, the pad oxide layer, and the silicon substrate 1.

In addition, a first capacitor electrode and the capacitor dielectric are formed by generally known methods. Thereafter, a polysilicon filling 31 is filled into the capacitor trenches, the polysilicon filling is recessed, and an isolation collar 32 is formed in the upper portion of the trench capacitor to suppress a parasitic transistor, which could otherwise be formed at this portion. The polysilicon filling 31 forms the inner capacitor electrode. The resulting structure is filled with a second polysilicon filling and planarized by known methods. Thereafter, the polysilicon filling is recessed so that the surface of the silicon filling 36 is above the substrate surface 10. Thereby, a connection between the inner capacitor electrode 31 and the transistor is implemented as a single-sided surface strap or a single-sided buried strap adjacent to the substrate surface 10. This asymmetric connection between inner capacitor electrode and the transistor is provided by generally known methods.

During the following thermal steps, the polysilicon filling 36 diffuses out passing the buried strap window 4 to the active area 12 to form a buried strap outdiffusion 33.

Next, isolation trenches are formed in a plane before and behind the illustrated drawing plane. Thereafter, the isolation trenches are filled with a silicon dioxide material, whereby the trench top oxide portion 34 is formed. As a result, active area lines 12 are formed with two longer and two shorter sides. The active area lines 12 are delimited on either of the longer sides by isolation trenches 2. The isolation trenches 2 electrically insulate neighboring active area lines 12 from each other. Trench top oxide portions 34 are provided on the shorter sides of the active area lines. The trench top oxide electrically insulates adjacent active area lines assigned to one row of the memory cell array.

Figure 1B:
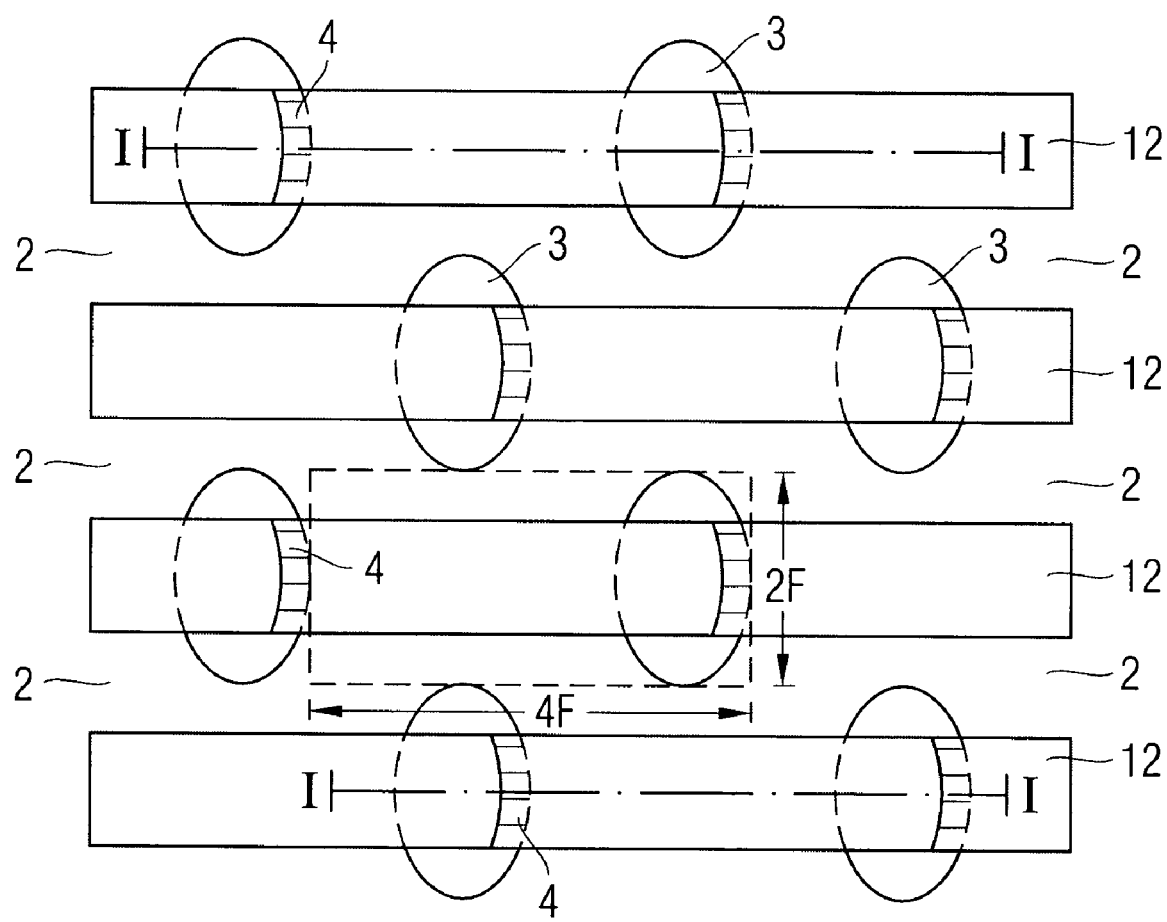

FIG. 1B shows a plan view on the resulting structure. Active areas 12 are defined by forming isolation trenches 2. Two isolation trenches are adjacent to one active area 12. In addition, the trench capacitors 3 are formed to intersect the active areas 12. The position of the cross-sectional view shown in FIG. 1A is indicated by broken lines between I and I.

Referring to FIG. 1B, the memory cells have a total area of 8 $F^2$ (4 F×2 F), wherein F denotes the minimum lithographic feature size obtained by the technology used. For example, currently, F is 90 to 110 nm, or even less.

Next, gate grooves 5 are formed by etching grooves into the active areas using an appropriate mask for defining the grooves. For example, the grooves extend to the depth of approximately 2 F from the substrate surface 10. Optionally, the bottom of the channel is implanted to provide the channel implantation portion 41. Thereby, the threshold voltage of the access transistor 16 is adjusted. A cross-section of the resulting structure 1 is shown in FIG. 2A.

Figure 2B:
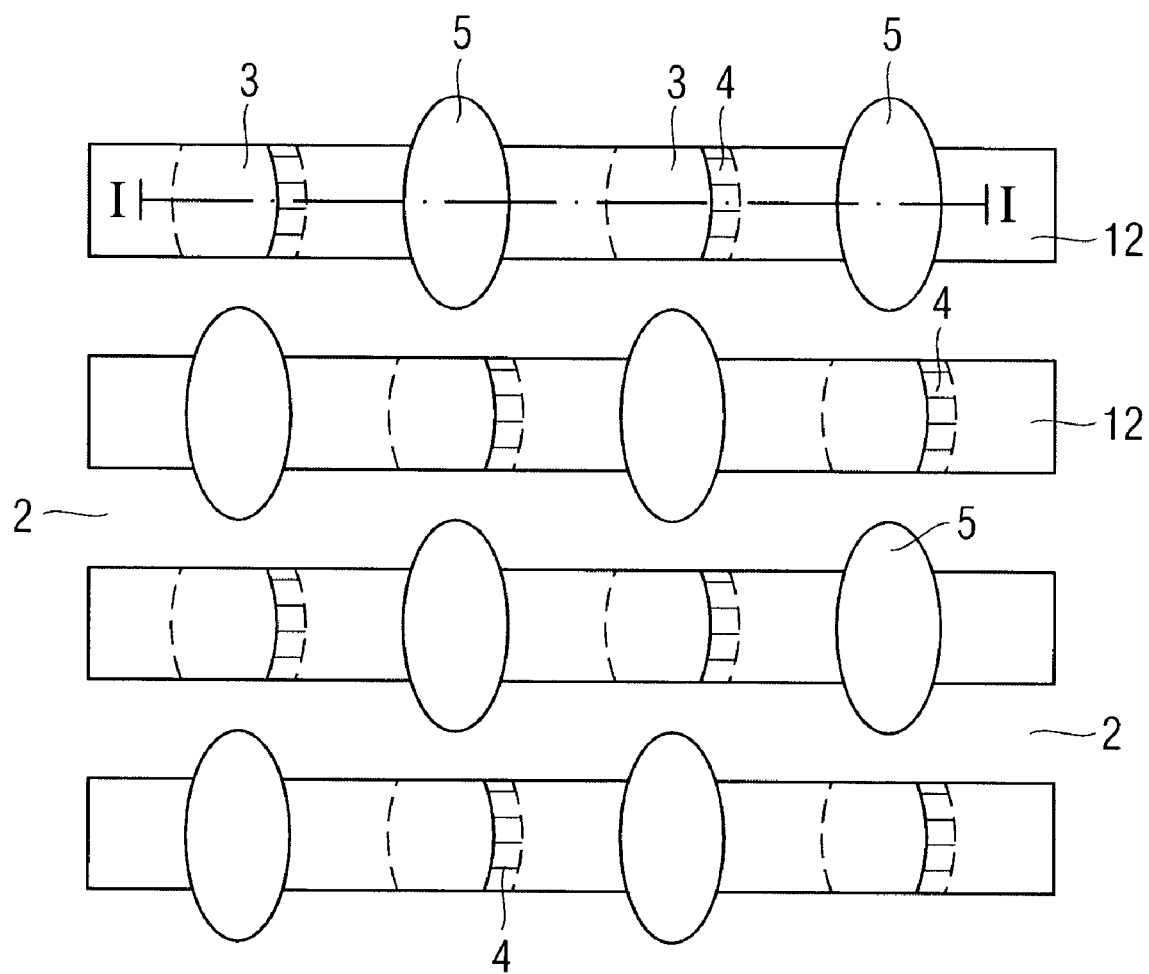

FIG. 2B shows a plan view on the resulting structure. The trench capacitors are arranged in a checkerboard-like layout, wherein the trenches of adjacent rows are disposed at staggered positions. Between adjacent trenches of one active area, gate grooves 5 are disposed.

Thereafter, a gate oxide layer 80 is formed by generally known methods. In the next step, a polysilicon layer 184 is deposited and recessed so that the lower portion of the gate grooves 5 is filled with the polysilicon layer 184. In addition, a side wall oxide is grown on the side walls of the gate grooves 5. Thereafter, the lightly doped portions of the first and second source/drain regions 121, 122 are provided by performing an angled ion implantation step 13. In this angled ion implantation, the ions are not implanted perpendicularly with respect to the substrate surface 10, but at a predetermined angle so that the first and second source/drain regions 121, 122 extend to a predetermined depth. Optionally, an asymmetric implantation, for example, with phosphorous, is performed to provide the asymmetric doped portion 123 disposed beneath the second source/drain region. By providing the asymmetric doped portion 123, the electrical field at the second source/drain region 122 is decreased and results in a reduced leakage current and an improved retention time.

Optionally, an inner spacer 86 is provided. The resulting structure is shown in FIG. 3.

Next, the horizontal portion of the inner spacer 86 covering the polysilicon layer 184 is removed and a further polysilicon layer 185 is deposited. Thereafter, Chemical Mechanical Polishing (CMP) is performed, thereby obtaining the structure shown in FIG. 4.

Then, the pad nitride layer 17 is removed from the whole surface. Thereby, the array portion and the peripheral portion of the memory device is uncovered. Thereafter, optionally, a silicon dioxide spacer 181 is formed by generally known methods, for example, by conformally depositing a silicon dioxide layer and performing an anisotropic etching step to remove the horizontal portions of the silicon dioxide layer. The oxide spacer 181 reduces the capacitive coupling between the gate contacts to be formed later. Thereafter, a thin silicon nitride liner 182, 186 having a thickness of about 10 nm is formed on the array portion and on the peripheral portion.

Figure 5A:
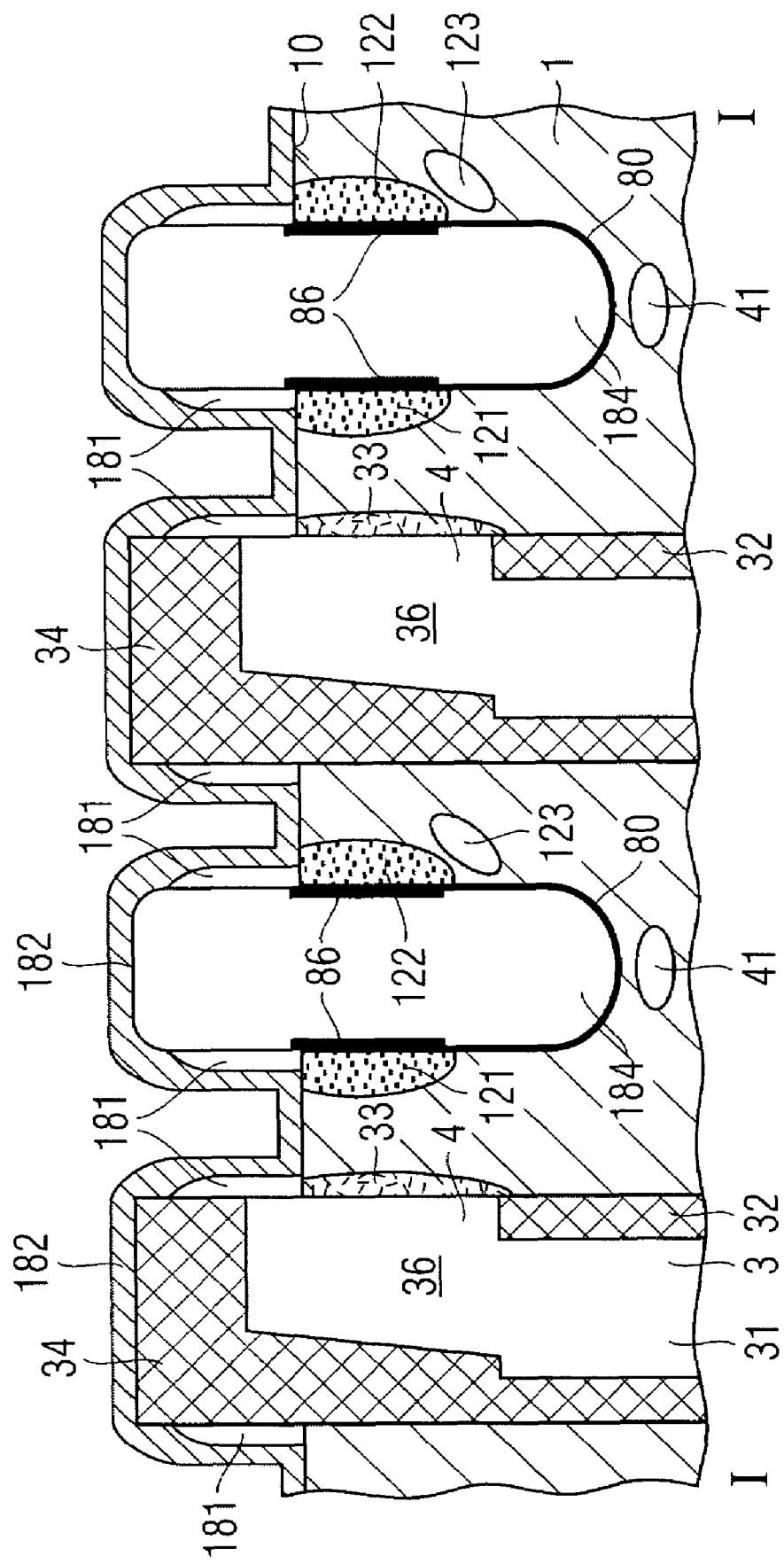
Figure 5B:
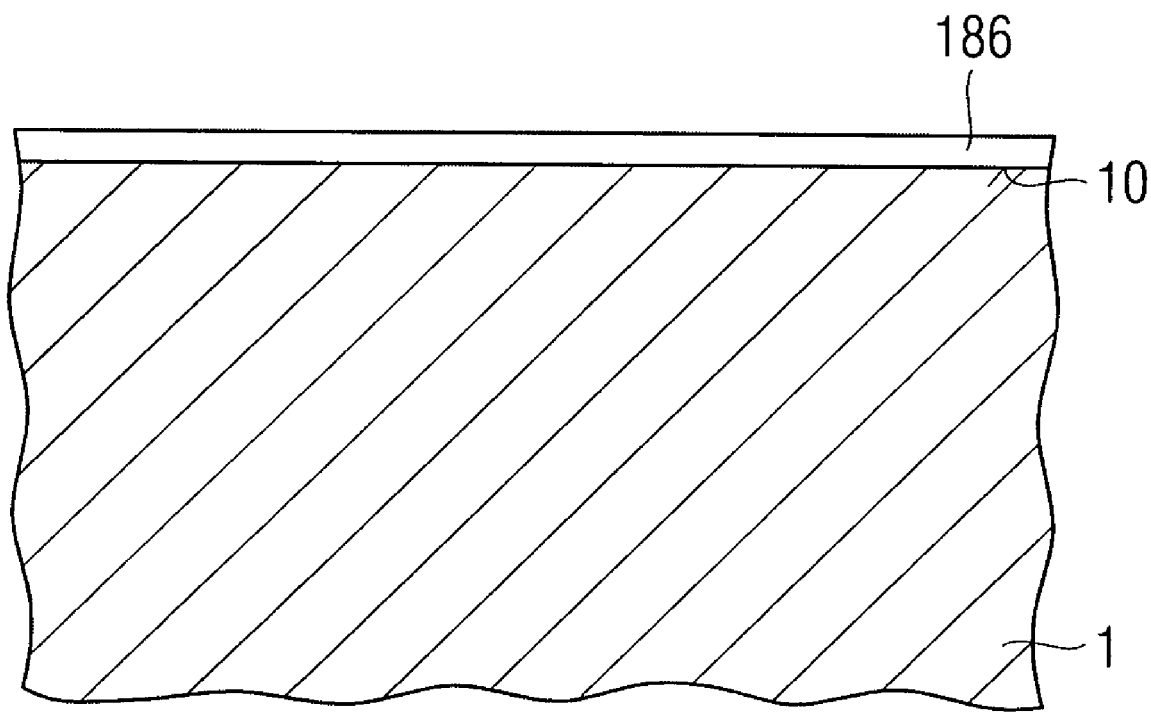

The resulting structure is shown in FIGS. 5A and 5B.

FIG. 5A shows a cross-sectional view of the memory cell array. The sidewalls of the gate electrodes 85 and the protruding portions of the trench capacitors 3 are covered with a silicon dioxide spacer 181. The array portion is covered with the silicon nitride liner 182. In addition, FIG. 5B shows a cross-sectional view of the peripheral portion wherein a silicon nitride liner 186 is deposited on the surface 10 of the silicon substrate.

Since according to the present invention forming the gate electrode is separated from forming the word lines, forming the gate electrodes for the transistors in the peripheral portion is separated from forming the word lines in the array portions. Accordingly, in the following the transistors in the peripheral portions are completed. The array portions are covered by the silicon nitride liner 182.

For completing the transistors in the peripheral portion, first the well implants which usually are performed, a reconducted in the peripheral portion. Thereafter, a gate oxide layer 76 is formed, as is known. In addition, the gate electrodes are formed by depositing a polysilicon layer and patterning the polysilicon layer by a generally known method. Since formation of the gate electrode in the peripheral portion is not identical to formation of the word lines in the array portion, the gate electrodes and the material of the gate electrodes in the peripheral portion are optimized. In particular, the gate electrodes in the peripheral portion can be made without tungsten and without a cap nitride.

Figure 6A:
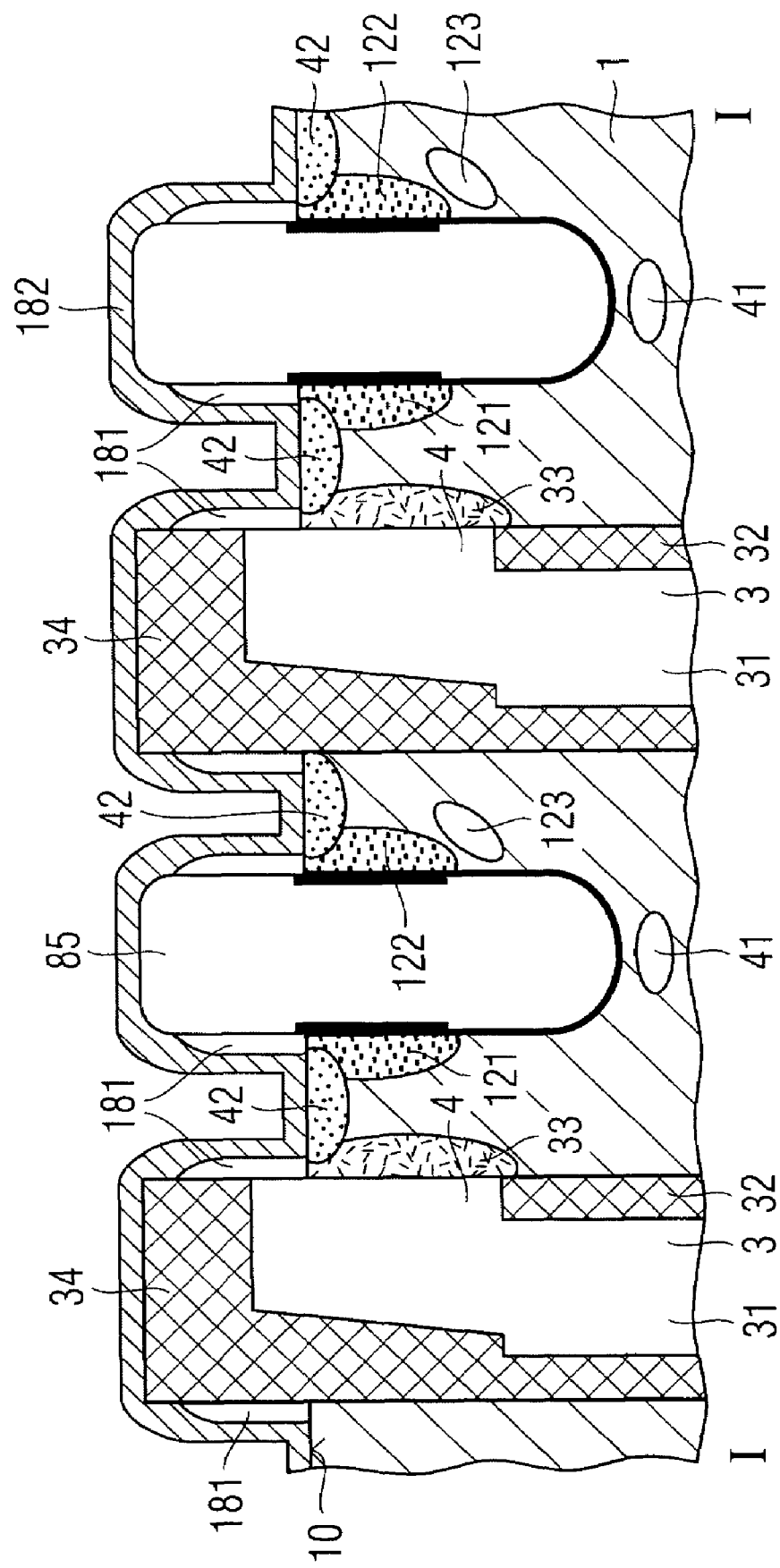
Figure 6B:
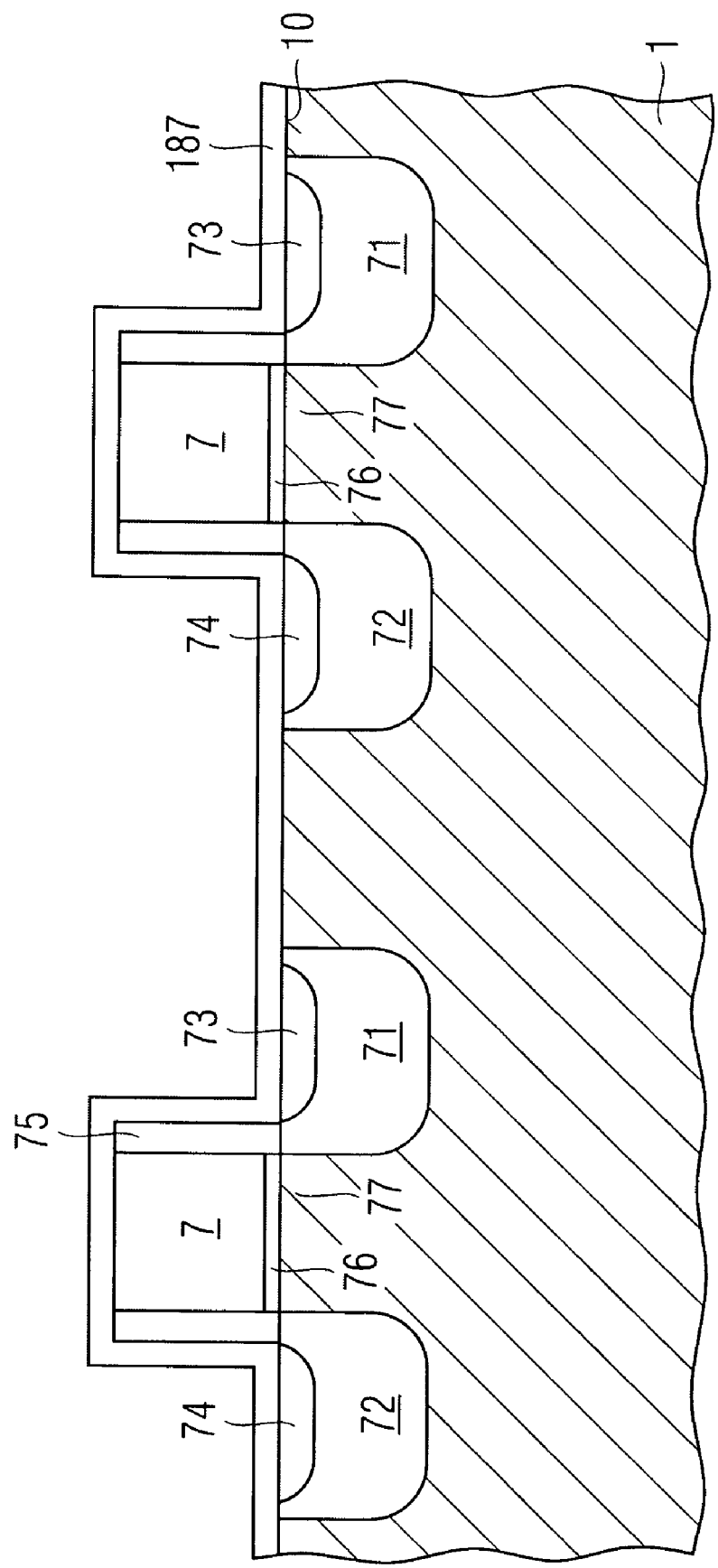

Thereafter, lightly doped portions of the first and second source/drain regions 71,72 are defined by performing an implantation and asymmetric doped portions are provided. By this implantation, the lightly doped portions of the array transistor are provided. This implantation is, for example, performed with As ions. Then, a spacer is provided at the side walls of the gate electrodes 7 and removed from the vertical portions in the array portion thereafter. Next, heavily doped portions are provided to form the heavily doped portions of the first and second source/drain electrodes 73, 74. Optionally, a salicidation is performed by depositing a thin layer of a metal, such as Ti, Ni, or Co, performing an annealing step to form TiSi, NiSi, or CoSi, and removing the unreacted portions of the metal layer. Thereafter, a $Si_3N_4$ liner 187 is deposited in a known manner. The resulting structure is shown in FIG. 6B.

Figure 7:
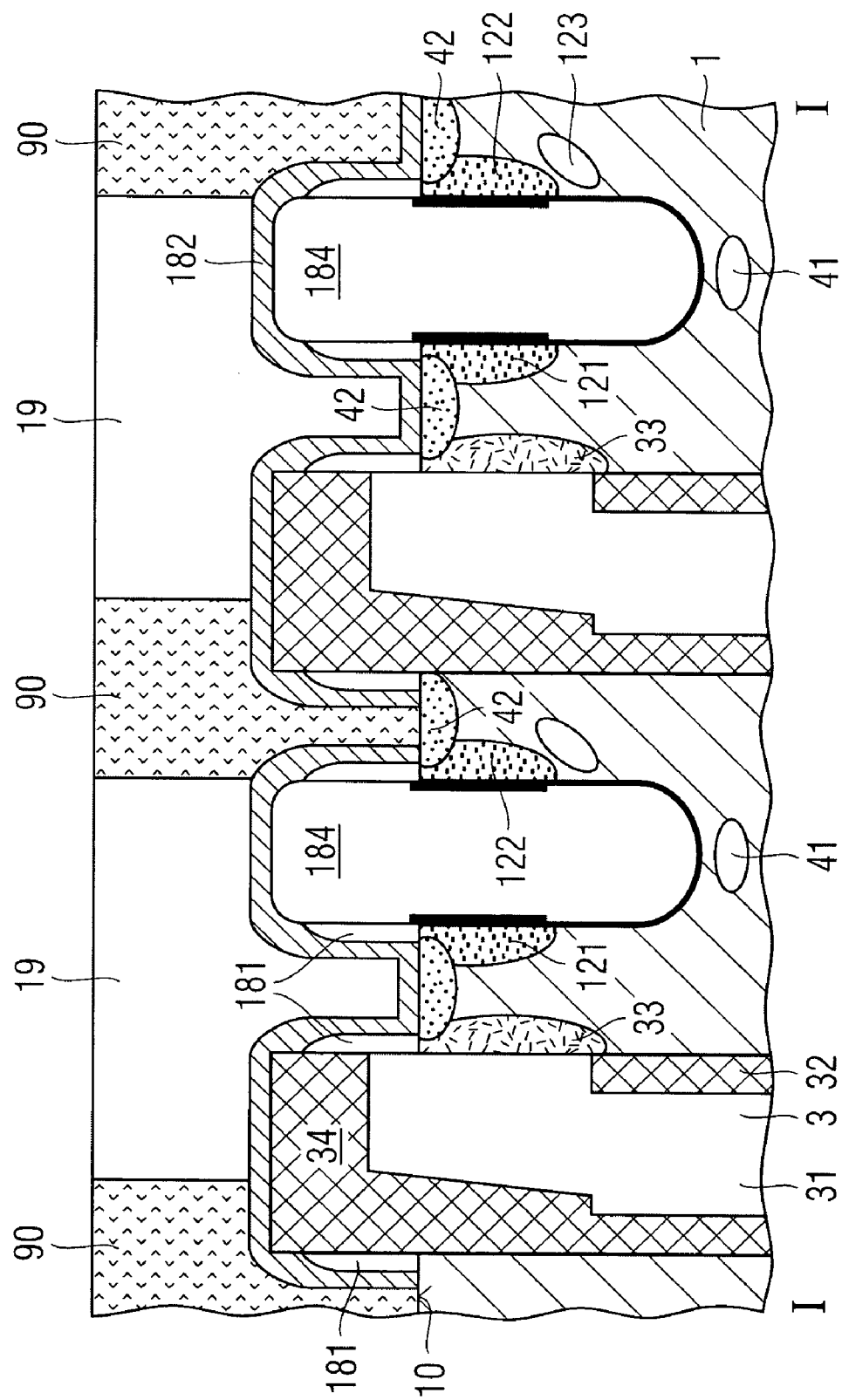

Next, bit line contacts 90 are formed by first, covering the whole array surface with a polysilicon layer (not shown) having a large thickness, and performing a CMP. As a result, the spaces between the trenches and the gate electrodes are filled with a polysilicon material. On the resulting surface, a further polysilicon layer (not shown) is deposited, and a mask layer is provided and patterned. As a result, those portions, at which the bit line contacts are not to be formed, are covered with the mask layer. Using this mask as an etching mask, the polysilicon material is removed from the portions at which the bit line contacts are not to be formed. As a result, the portions at which the bit line contacts 90 are to be formed are filled with polysilicon as a sacrificial material. In the next step, a BPSG layer is deposited and a CMP is performed. Thereafter, the sacrificial material is removed from the portions at which the bit line contacts 90 are to be formed. Next, a reactive ion etching (RIE) is performed to remove the exposed parts of the horizontal portion of the silicon nitride layer 182. Then, the openings are filled with a conductive material, such as polysilicon or tungsten. Thereafter, a further CMP is performed to obtain the structure shown in FIG. 7.

Figure 8:
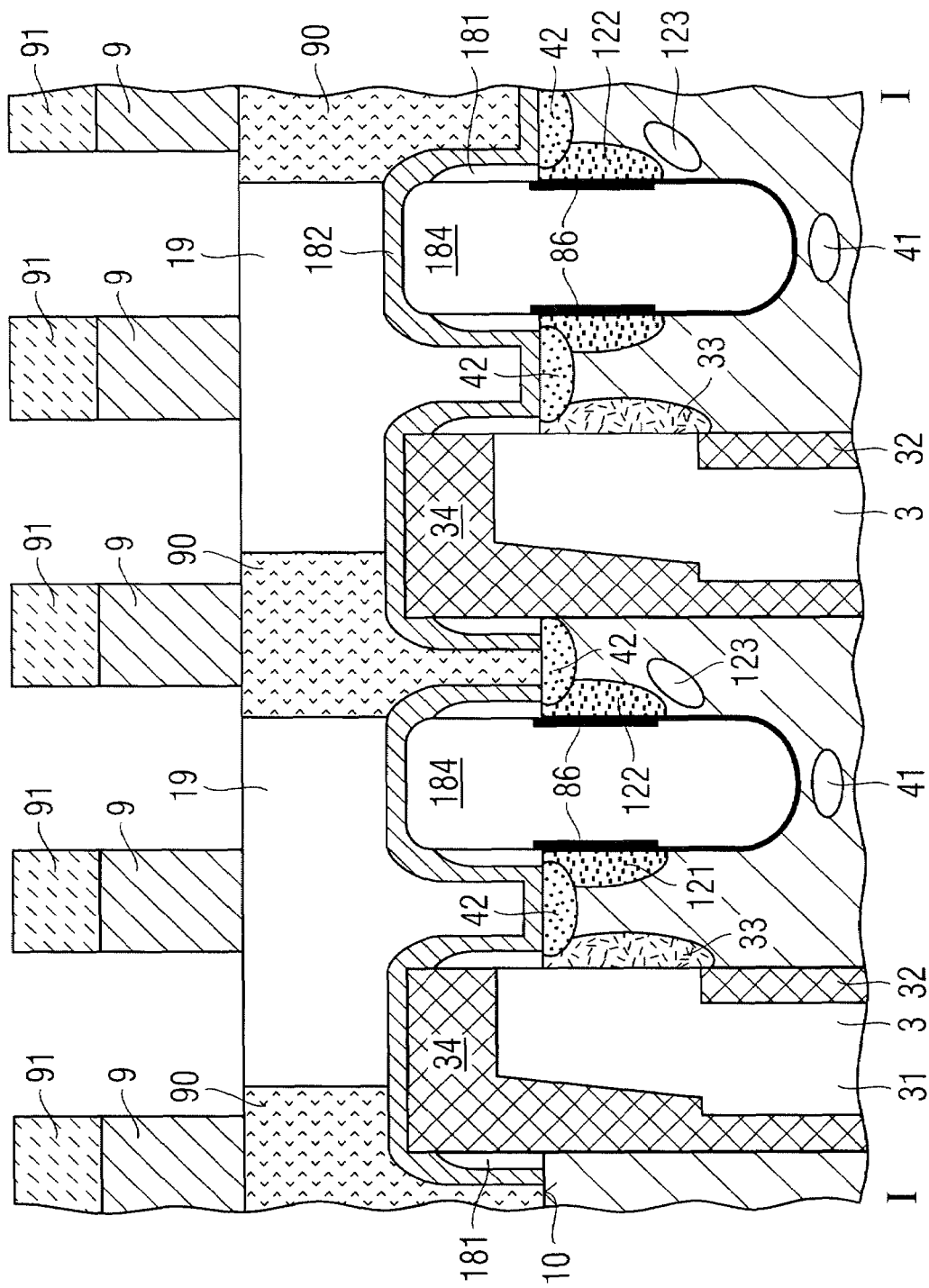
Figure 9:
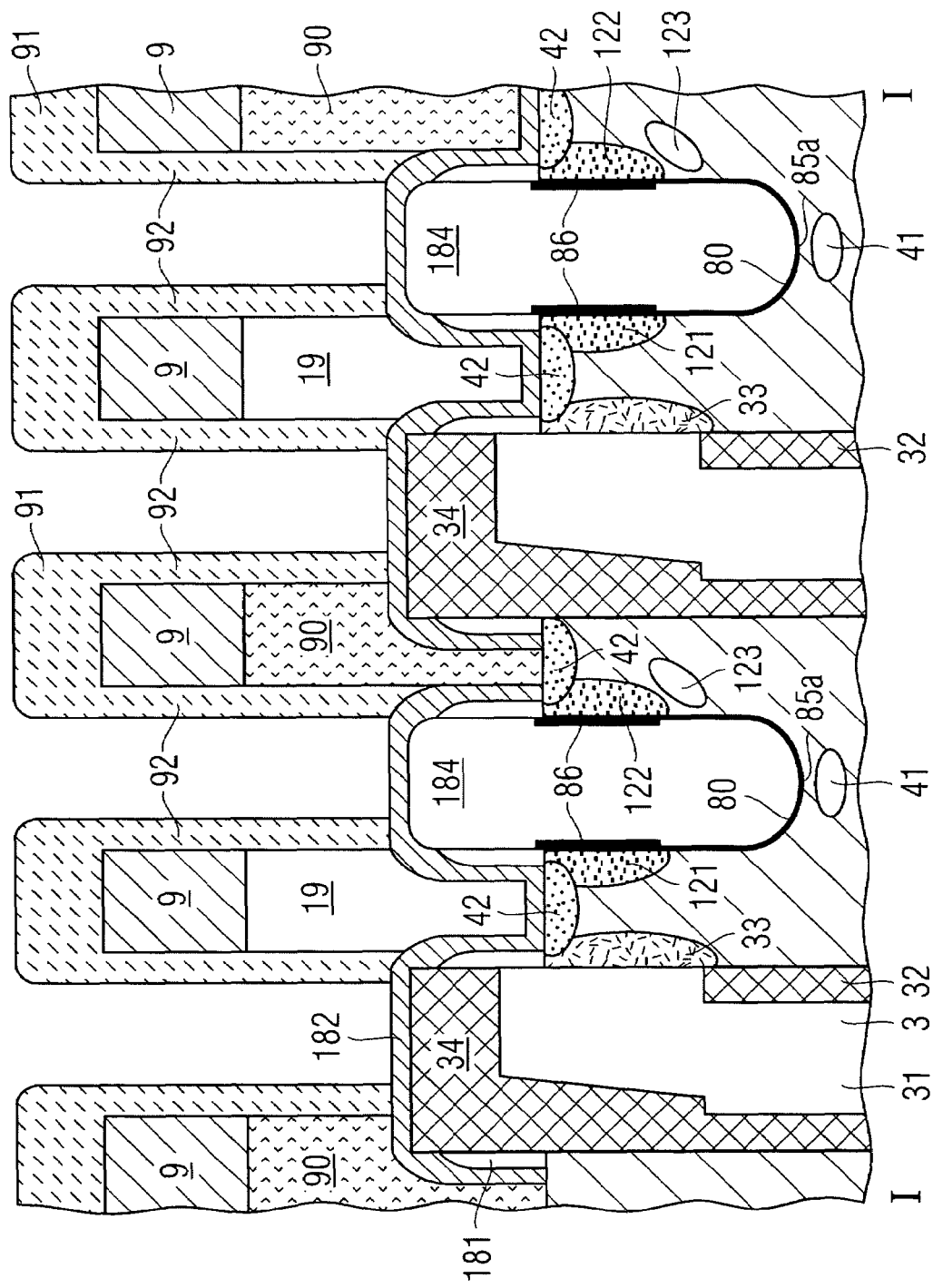

Thereafter, the bit lines are formed. For example, a polysilicon layer and a cap nitride layer 91 are deposited and patterned using an appropriate mask. As is shown in FIG. 8, the bit lines are arranged in a direction perpendicular with respect to the active areas 12.

Thereafter, an over-etching is performed to remove the portions of the BPSG layer 19 and the bit line contacts 90, which are not covered by the bit lines. Next, a silicon nitride spacer 92 is formed by a conventional process. Optionally, an additional oxide spacer (not shown) are formed to enable the formation of the gate contacts.

Then, the word lines and the gate contacts are defined. For example, the gate contacts are defined by depositing a BPSG layer 81 and patterning the gate contacts 83. Thereafter, a conductive material is filled to simultaneously form the gate contacts 83 and the word line layer. The word lines 8 are defined by patterning the deposited conductive layer.

Alternatively, the gate contacts are defined in a similar manner to the bit line contacts. For example, sacrificial plugs of polysilicon are formed at the positions at which the gate contacts are to be formed. Thereafter, a BPSG layer is deposited, followed by a CMP. The sacrificial contacts are then removed, and a conductive layer is deposited. The deposited layer simultaneously forms the gate contacts 83 and the word lines after patterning the word lines using an appropriate mask. A cross-sectional view of the resulting structure is shown in FIG. 10A.

FIG. 10B shows a plan view on the resulting memory cell array, showing bit lines 9 that are perpendicular to the active areas 12. In particular, two bit lines are adjacent to each trench and each gate groove, respectively. The word lines 8 are disposed above the active areas 12. The gate electrodes 85 are connected with the word lines 8 via gate contacts 83. The transistors are connected with the bit lines 9 via bit line contacts 90.

Figure 11:
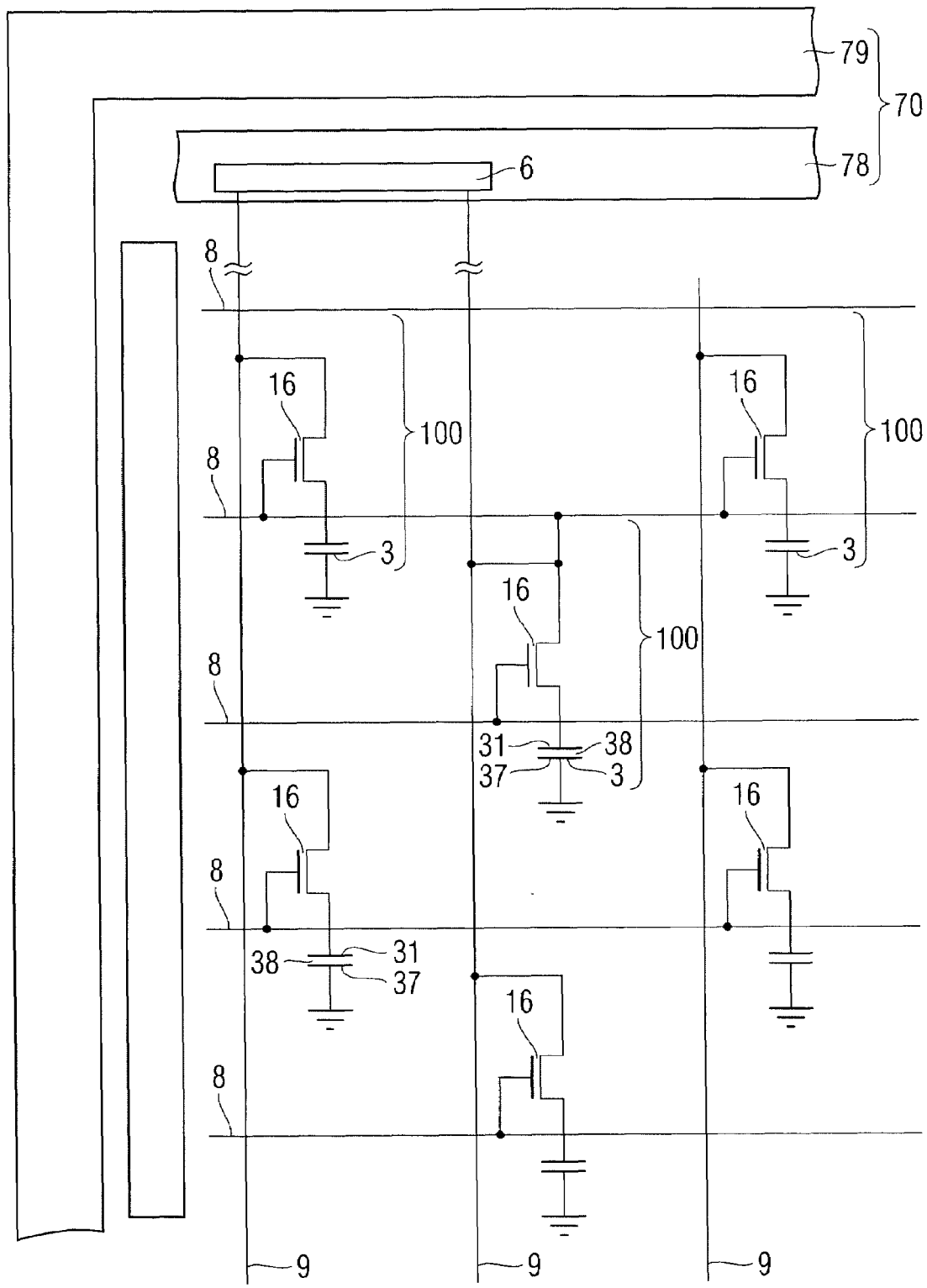
FIG. 11 shows a plan view of a memory device comprising the memory cell array of the present invention.

FIG. 11 shows a layout of a memory device incorporating the memory cell array of the present invention. In the central portion of the depicted memory device, the memory cell array including the memory cells 100 is disposed. The memory cells 100 are arranged in a checkerboard pattern, so that the individual memory cells are diagonally arranged with respect to each other. Each memory cell includes a storage capacitor 3 with an inner capacitor electrode 31, an outer capacitor electrode 37, a capacitor dielectric 38, and an access transistor 16. The first source/drain region 121 of the transistor 16 is connected to the inner capacitor electrode 31 and the second source/drain region 122 of the transistor 16 is connected to a corresponding bit line 9. The word line 8 is connected to the gate electrode 85 of the transistor 16.

In operation, one memory cell 100 is selected, for example, by activating one word line 8. The word line 8 is coupled to the gate electrode of a respective one of the transistors 16. The bit line 9 is coupled to the second source/drain region of one of the transistors 16. The transistor 16 is then turned on, coupling the charge stored in the capacitor 3 to the associated bit line 9. The sense amplifier 6 senses the charge coupled from the capacitor 3 to the bit line 9. The sense amplifier 6 compares the obtained signal with a reference signal obtained from a neighboring bit line 9 sensing a signal from a memory cell 100 connected to a neighboring word line 8 that is not activated.

The sense amplifier 6 forms part of the core circuitry, in which as well the word line drivers (not shown) are arranged. The peripheral portion 70 further includes the support region disposed outside the core circuitry.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCES

1 semiconductor substrate
10 substrate surface
12 active area
121 first source/drain region 122 second source/drain region
123 asymmetric doped portion
13 angled ion implantation
14 channel
15 current path
16 transistor
17 pad nitride
181 silicon dioxide spacer
182 Si$_3$N$_4$ liner
184 polysilicon layer
185 polysilicon layer
186 Si$_3$N$_4$ liner
187 polysilicon liner
188 Si$_3$N$_4$ layer
19 BPSG layer
2 isolation trench
3 trench capacitor
31 inner capacitor electrode
32 isolation collar
33 buried strap outdiffusion
34 trench top oxide
36 polysilicon filling
37 outer capacitor electrode
38 capacitor dielectric
4 buried strap window
41 channel implantation
42 implanted portion
5 gate groove
51 hard mask layer
52 hard mask layer
6 sense amplifier
7 peripheral gate electrode
71 peripheral lightly doped first source/drain region
72 peripheral lightly doped second source/drain region
73 peripheral heavily doped first source/drain region
74 peripheral heavily doped second source/drain region
75 Si$_3$N$_4$ spacer
76 peripheral gate oxide
77 peripheral channel
78 core circuitry
79 support portion
70 peripheral portion
8 word line
8a bottom side of the word line
80 gate oxide
81 BPSG layer
82 tungsten layer
83 gate contact
85 gate electrode
85a bottom side of the gate electrode
86 inner spacer
9 bitline
9a active bitline
9b passing bitline
90 bitline contact
91 bitline isolator layer
92 bitline isolator
93 first contact region
94 second contact region
100 memory cell

What is claimed is:

1. A memory cell array, comprising:
a plurality of memory cells, each memory cell including a storage capacitor and an access transistor;
a plurality of bit lines oriented in a first direction;
a plurality of word lines oriented in a second direction, the second direction being perpendicular to the first direction; and
a semiconductor substrate with a surface and a plurality of active area lines formed therein, a longer side of each active area line extending in the second direction;
wherein access transistors of the memory cells are at least partially formed in the active area lines and electrically couple corresponding storage capacitors to corresponding bit lines, each access transistor including:
a first source/drain region connected to an electrode of the storage capacitor,
a second source/drain region adjacent to the substrate surface,
a channel region connecting the first and second source/drain regions, the channel region disposed in the active area, and
a gate electrode disposed along the channel region, the gate electrode controlling an electrical current flowing between the first and second source/drain regions, the gate electrode connected with one of the word lines,
wherein each gate electrode includes a bottom side, each word line includes a bottom side, the bottom side of the gate electrodes being disposed beneath the bottom side of the word lines, and the word lines are disposed above the bit lines.

2. The memory cell array of claim 1, wherein each gate electrode is disposed in a groove, the groove extending in a direction perpendicular to the substrate surface.

3. The memory cell array of claim 1, wherein each storage capacitor is a trench capacitor including a first capacitor electrode, a second capacitor electrode, and a dielectric layer disposed between the first and second capacitor electrodes, the first and second capacitor electrodes and the dielectric layer being disposed in a trench extending in the semiconductor substrate.

4. The memory cell array of claim 1, wherein the gate electrode is connected with a corresponding word line via a gate contact.

5. The memory cell array of claim 1, further comprising:
an insulating spacer electrically insulating the gate electrode from the first and second source/drain regions, the insulating spacer extending perpendicularly with respect to the semiconductor substrate surface.

6. The memory cell array of claim 1, wherein the channel connecting the first and second source/drain regions includes vertical portions and a horizontal portion with respect to the substrate surface, the horizontal portion being adjacent to the bottom side of the gate electrode.

7. The memory cell array of claim 6, wherein the horizontal portion of the channel includes a region doped with a dopant of a conductivity type of the channel at a higher concentration than a dopant concentration of the channel.

8. The memory cell array of claim 1, wherein the word lines are made of a metal.

9. A method of forming a memory cell array, comprising:
providing a semiconductor substrate having a surface;
providing a plurality of storage capacitors;
defining a plurality of active area lines in the semiconductor substrate;
providing a plurality of access transistors by providing a first source/drain region in one of the active areas;
electrically connecting the first source/drain region with an electrode of the storage capacitor;
providing a second source/drain region in the active area at a position adjacent to the substrate surface;

providing a gate electrode disposed along the channel region;

providing a plurality of bit lines extending along a first direction; and providing a plurality of word lines extending along a second direction, each word line connected to a plurality of gate electrodes, wherein the active areas extend in the second direction, each gate electrode includes a bottom side, each word line includes a bottom side, the bottom side of the gate electrodes is disposed beneath the bottom side of the word lines, and wherein providing bit lines occurs before providing word lines.

10. The method of claim 9, wherein providing the gate electrode includes defining a groove extending in a direction perpendicular to the substrate surface.

11. The method of claim 9, wherein providing a storage capacitor includes
forming a trench extending in a direction perpendicular to the substrate surface, the trench having a sidewall,
providing a first capacitor electrode adjacent to the sidewall,
providing a dielectric layer on the first capacitor electrode, and
providing a second capacitor electrode adjacent to the dielectric layer.

12. The method of claim 9, further comprising:
providing a gate contact connecting the gate electrode with a corresponding word line.

13. The method of claim 9, further comprising:
providing an insulating spacer, the insulating spacer electrically insulating the gate electrode from the first and second source/drain regions, the insulating spacer extending perpendicularly with respect to the semiconductor substrate surface.

14. The method of claim 9, further comprising:
doping a portion of the channel adjacent to the bottom side of the gate electrode with a dopant of a conductivity type of the channel at a higher concentration than a dopant concentration of the channel.

15. The memory cell array of claim 1, wherein a current path of the electrical current flow between the first and second source/drain regions includes, in sequence, a vertical component, a horizontal component, and another vertical component.

16. A memory cell array, comprising:
a plurality of memory cells, each memory cell including a storage capacitor and an access transistor;
a plurality of bit lines oriented in a first direction;
a plurality of word lines oriented in a second direction, the second direction being perpendicular to the first direction; and
a semiconductor substrate with a surface and a plurality of active area lines formed therein, each active area extending in the second direction;
wherein access transistors of the memory cells are at least partially formed in the active area lines and electrically couple corresponding storage capacitors to corresponding bit lines, each access transistor including:
a first source/drain region connected to an electrode of the storage capacitor,
a second source/drain region adjacent to the substrate surface,
a channel region connecting the first and second source/drain regions, the channel region disposed in the active area, and a gate electrode disposed along the channel region, the gate electrode controlling an electrical current flowing between the first and second source/drain regions, the gate electrode connected with one of the word lines, wherein each gate electrode includes a bottom side, each word line includes a bottom side, the bottom side of the gate electrodes being disposed beneath the bottom side of the word lines, and wherein an upper surface of each of the word lines is disposed above an upper surface of each of the bit lines.

17. A memory cell array, comprising:
active area lines formed in a semiconductor substrate; and
a plurality of memory cells which include a storage capacitor and an access transistor, the memory cells being at least partially formed in the active area lines, individual ones of the access transistors including:
a first and second source/drain regions;
a channel region extending between the first and second source/drain regions, the channel region including vertical portions and a horizontal portion with respect to a surface of the semiconductor substrate, wherein the horizontal portion of the channel includes a region doped with a dopant of a conductivity type of the channel region at a higher concentration than a dopant concentration of other regions of the channel region, and
a gate electrode disposed along the channel region and configured to control an electrical current flowing between the first and second source/drain regions, wherein the horizontal portion of the channel region is adjacent to a bottom side of the gate electrode.

18. A memory cell array, comprising:
a plurality of memory cells which include a storage capacitor and an access transistor;
a plurality of bit lines oriented in a first direction;
a plurality of word lines oriented in a second direction substantially perpendicular to the first direction;
a semiconductor substrate with a surface and a plurality of active area lines formed therein, a longer side of each active area line extending in the second direction such that the active area lines are parallel to the word lines, wherein access transistors of the memory cells are at least partially formed in the active area lines, individual ones of the access transistors including:
a first source/drain region coupled to an electrode of the storage capacitor,
a second source/drain region coupled to a respective bit line,
a channel region disposed in the active area and extending between the first and second source/drain regions, and
a gate electrode disposed along the channel region and configured to control an electrical current flowing between the first and second source/drain regions, the gate electrode being coupled to a respective word line.

19. A memory cell array, comprising:
a plurality of memory cells which include a storage capacitor and an access transistor;
a plurality of bit lines oriented in a first direction;
a plurality of word lines oriented in a second direction substantially perpendicular to the first direction;
a semiconductor substrate with a surface and a plurality of active area lines formed therein, wherein access transistors of the memory cells are at least partially formed in the active area lines, individual ones of the access transistors including:

a first source/drain region coupled to an electrode of the storage capacitor, a second source/drain region coupled to a respective bit line, a channel region disposed in the active area and extending between the first and second source/drain regions, and a gate electrode disposed along the channel region and configured to control an electrical current flowing between the first and second source/drain regions, the gate electrode being coupled to a respective word line, wherein an upper surface of each of the word lines is disposed above an upper surface of each of the bit lines.

* * * * *